(12) United States Patent
Kamino et al.

(10) Patent No.: US 11,588,124 B2
(45) Date of Patent: Feb. 21, 2023

(54) PHOTOVOLTAIC MODULE

(71) Applicant: CSEM CENTRE SUISSE D'ELECTRONIQUE ET DE MICROTECHNIQUE SA—RECHERCHE ET DÉVELOPPEMENT, Neuchâtel (CH)

(72) Inventors: Brett Kamino, Neuchâtel (CH); Björn Niesen, Suhr (CH); Christophe Alsadat Ballif, Neuchâtel (CH); Nicolas Badel, La Praz (CH); Antonin Faes, Yvonand (CH); Jonas Geissbühler, Les Geneveys-sur-Coffrane (CH); Matthieu Despeisse, Neuchâtel (CH)

( * ) Notice: Subject to any disclaimer, the term of this patent is extended or adjusted under 35 U.S.C. 154(b) by 0 days.

(21) Appl. No.: 17/296,334

(22) PCT Filed: Nov. 21, 2019

(86) PCT No.: PCT/EP2019/082070
§ 371 (c)(1),
(2) Date: May 24, 2021

(87) PCT Pub. No.: WO2020/109129
PCT Pub. Date: Jun. 4, 2020

(65) Prior Publication Data
US 2022/0102659 A1 Mar. 31, 2022

(30) Foreign Application Priority Data
Nov. 30, 2018 (EP) .................................... 18209517

(51) Int. Cl.
*H01L 51/44* (2006.01)
*H01L 51/42* (2006.01)

(52) U.S. Cl.
CPC .......... *H01L 51/44* (2013.01); *H01L 51/4213* (2013.01)

(58) Field of Classification Search
CPC .......................... H01L 51/44; H01L 51/4213
See application file for complete search history.

(56) References Cited

U.S. PATENT DOCUMENTS

2009/0120493 A1* 5/2009 Sinha .................. H01L 31/1804
136/255
2012/0145231 A1 6/2012 Woods
(Continued)

OTHER PUBLICATIONS

Sahli et al.: "Fully textured monolithic perovskite/silicon tandem solar cells with 25.2% power conversion efficiency", Nature Materials, vol. 18, 2018, pp. 820-826, XP036572898, DOI: 10.1038/s41563-018-0115-4.
(Continued)

*Primary Examiner* — Tae-Sik Kang
(74) *Attorney, Agent, or Firm* — Duane Morris LLP; Gregory M. Lefkowitz; Randall C. Pyles (57) ABSTRACT

Photovoltaic module comprising a plurality of multijunction photovoltaic cells, at least one of said multijunction photovoltaic cells comprising:
a first photovoltaic sub-cell extending over a first predetermined area;
a second photovoltaic sub-cell provided on said first photovoltaic sub-cell and in electrical connection therewith, said second photovoltaic sub-cell extending over a second predetermined area which is smaller than said first predetermined area so as to define at least one zone in which said first photovoltaic sub-cell is uncovered by said second photovoltaic sub-cell;
an electrically-insulating layer situated upon said first photovoltaic sub-cell in at least a part of said zone; and
an electrically-conductive layer situated upon at least part of said electrically-insulating layer and in electrical connection with a surface of said second photovoltaic sub-cell,
(Continued)

wherein at least one of said multijunction photovoltaic cells is electrically connected to at least one other of said multijunction photovoltaic cells by means of at least one electrical interconnector electrically connected to said electrically-conductive layer in said zone.

7 Claims, 6 Drawing Sheets

(56) References Cited

U.S. PATENT DOCUMENTS

2015/0349702 A1* 12/2015 Morad .................. H01L 31/048
                                                              136/251
2017/0133542 A1   5/2017 Derkacs
2018/0226529 A1*  8/2018 Uzu ...................... H01L 27/302

OTHER PUBLICATIONS

Eitner, U.Rendlar, L.C.: "Peel testing of ribbons on solar cells at different angles consistent comparison by using adhesive fracture energies", 29th EUPVSEC, Sep. 22, 2014 (Sep. 22, 2014).

Mittag et al.: "Cell-to-Module (CTM) Analysis tor Photovoltaic Modules with Shingled Solar Cells", 44th IEEE Photovoltaic Specialist Conference, 2017.

Rolston et al.: "Mechanical integrity of solution-processed perovskite solar cells", Extreme Mechanics Letters 9 (2016) 353-358.

Rongrong et al.: "Design and understanding of encapsulated perovskite solar cells to withstand temperature cycling", Energy Environ. Sci., Nov. 2018, 144.

* cited by examiner

PHOTOVOLTAIC MODULE

CROSS-REFERENCE TO RELATED APPLICATIONS

This application is a § 371 national stage entry of International Application No. PCT/EP2019/082070, filed Nov. 21, 2019, which claims priority to European Patent Application No. 18209517.4, filed Nov. 30, 2018, the entire contents of which are incorporated herein by reference.

TECHNICAL FIELD

The present invention relates to the technical field of photovoltaic (PV) modules. More particularly, it relates to a photovoltaic module comprising a plurality of interconnected multijunction photovoltaic cells.

STATE OF THE ART

As described in the paper "*Fully textured monolithic perovskite/silicon tandem solar cells with 25.2% power conversion efficiency*", Sahli et al, *Nature Materials* 18, 820-826 (2018), perovskite/silicon tandem solar cells are promising candidates to achieve power conversion efficiencies of over 30%.

"Perovskites" are organometallic halide materials with a formula generically written as $ABX_3$, where A is an inorganic or organic cation such as Cs, $CH_3NH_3$ or $HC(NH_2)_2$, B is a metal such as tin or lead, and X is a halogen atom such as iodine, bromine or chlorine. Examples of such materials are methylammonium lead trihalide ($CH_3NH_3PbX_3$), Caesium formamidinum lead trihalide ($CsH_2NCHNH_2PbX_3$), and methylammonium tin triiodide ($CH_3NH_3SnI_3$). These compounds adopt a similar crystal structure to calcium titanium oxide ($CaTiO_3$) and, when illuminated, generate electron-hole pairs, which can be separated by sandwiching the perovskite absorber layer between an electron transporting n-type layer and a hole-transporting p-type layer, with the perovskite serving as the intrinsic (i) layer so as to form a PIN or NIP sub-cell, analogous to its silicon counterpart.

Due to their chemical makeup, perovskites exhibit relatively low mechanical strength when compared with inorganic PV materials such as thin-film or crystalline silicon, germanium and so on. This presents difficulties when electrically interconnecting multiple tandem cells incorporating perovskite-based PV sub-cells. In essence, the electrical interconnects from one cell to another exert mechanical stresses on the perovskite layer, and can cause fractures, delamination and other mechanical damage to the perovskite sub-cell. This applies not only in conventional interconnections of cells all lying in the same plane by means of wires or ribbons, but also in shingle structures where the cells are overlapped in the module like shingles on a roof. In this latter situation, the mechanical forces exerted on and by the electrical interconnections can be quite substantial, and can be exacerbated by thermal expansion and contraction during the thermally-assisted encapsulation process and in use since the material of the interconnector is different to that of the cell and hence expands and contracts differently. The same issue also exists with other cutting-edge PV technologies such as quantum dot, organic solar cells and so on.

An aim of the present invention is hence to propose a photovoltaic module in which the above-mentioned disadvantages are at least partially overcome.

DISCLOSURE OF THE INVENTION

More specifically, the invention relates to a photovoltaic module comprising a plurality of multijunction photovoltaic cells, at least one of said multijunction photovoltaic cells comprising:

a first photovoltaic sub-cell extending over a first predetermined area;

a second photovoltaic sub-cell provided directly or indirectly on said first photovoltaic sub-cell and in electrical connection therewith so as to form a multijunction cell, said second photovoltaic sub-cell extending over a second predetermined area which is smaller than said first predetermined area so as to define at least one zone, which may be a single contiguous zone or formed of several sub-zones, in which said first photovoltaic sub-cell is not covered by said second photovoltaic sub-cell and hence only said first photovoltaic sub-cell is present (optionally together with other layers not forming a photovoltaic sub-cell). In other words, the second photovoltaic sub-cell is not present in this zone;

an electrically-insulating layer situated upon the first photovoltaic sub-cell in at least a part of said zone; and an electrically-conductive layer electrically formed on at least part of said electrically-insulating layer and in electrical connection with a surface of said second photovoltaic sub-cell, arranged therefore to conduct current produced by the multijunction cell to the surface of said zone. It should be noted that electrically-conductive and electrically-insulating are to be interpreted in the usual manner in the technical field of the invention. For instance, a useful threshold between electrically-conductive and electrically-insulating can be taken at a conductivity of $10^{-3}$ S/m, typical values for electrically-conductive materials being above 1 S/m and typical values for electrically-insulating materials being below $10^{-5}$ S/m.

At least one of said multijunction photovoltaic cells is electrically connected to at least one other of said multijunction photovoltaic cells by means of at least one electrical interconnector electrically connected to said electrically-conductive layer in said zone of said at least one cell. In other words, the physical contact between the electrical interconnector and the cell occurs only in said zone, the electrical interconnector being physically attached to the conductive layer in said zone.

As a result, electrical connection between the cells on the side of the second sub-cell cannot physically interfere with the second sub-cell. Although applicable generally and independently of the type of sub-cells used (e.g. crystalline silicon, thin-film silicon, germanium, Perovskite, quantum dot, organic semiconductor and so on), this is particularly advantageous in the case in which the first sub-cell is of a mechanically more resistant type such as crystalline or thin-film silicon or germanium (or other inorganic semiconductor technology), and the second sub-cell is of a mechanically less resistant type such as Perovskite, quantum dot, organic semiconductor or similar. In this latter case, the electrical interconnector does not interact mechanically with the surface of the weaker second sub-cell since it is situated in the zone in which this latter is not present. The electrically-conductive layer ensures that the current produced by the multijunction is conducted onto the surface of the zone such that it can be transferred to the interconnector, the above-mentioned electrically-insulating layer preventing an unwanted electrical connection between the electrically-conductive layer and the surface of the first photovoltaic sub-cell in said zone.

Advantageously, said electrically-insulating layer extends over at least a part of a lateral face of said second photovoltaic sub-cell adjacent to said zone, which eliminates any risk of short circuits caused by the passage of the electrically-conductive layer down this face, if the structure of the cell is susceptible to such. If not, it is not necessary for the electrically-insulating layer to extend over this lateral face.

Advantageously, said first photovoltaic sub-cell comprises an inorganic semiconductor based photovoltaic sub-cell, thereby ensuring mechanical strength and resistance of this sub-cell for supporting the connection with the electrical interconnector.

Advantageously, said second photovoltaic sub-cell comprises at least one of:
a perovskite-based photovoltaic sub-cell;
an organic semiconductor based photovoltaic sub-cell;
a quantum dot based photovoltaic sub-cell.

These technologies give a high conversion efficiency to the multijunction cells.

Advantageously, said cells extend in substantially a single plane and wherein said interconnector is at least one wire or ribbon.

Alternately, said zone is situated at an edge of said photovoltaic cell, said photovoltaic cells being arranged in the module in a shingle configuration such that said interconnector is sandwiched between said zone of one photovoltaic cell and in electrical connection with the first sub-cell of an adjacent photovoltaic cell, for instance via an electrically-conductive contact layer.

Advantageously, wherein said photovoltaic cell further comprises an electrically-conductive contact layer situated directly or indirectly on a surface of said first photovoltaic sub-cell facing away from said second photovoltaic sub-cell, i.e. on the side opposite to the second sub-cell.

The invention also relates to two methods of manufacturing photovoltaic modules according to the invention.

The first variant of such a method comprises manufacturing a plurality of photovoltaic cells, and then assembling said plurality of photovoltaic cells into a photovoltaic module such that they are electrically interconnected by means of at least one interconnector.

At least one of these photovoltaic cells is manufactured by:
forming a first photovoltaic sub-cell;
forming a second photovoltaic sub-cell on part of a surface of said first photovoltaic sub-cell so as to define a zone in which said second photovoltaic sub-cell is not present, i.e. in which the first sub-cell is not covered by the second sub-cell;
forming an insulating layer on at the surface of said first photovoltaic sub-cell in at least part of said zone, e.g. by deposition by means of an appropriate process;
forming a conductive layer on at least part of said insulating layer and on at least part of said second photovoltaic sub-cell, again by means of an appropriate deposition process (such as printing, vapour deposition or similar), so as to be in electrical connection with the surface of the second photovoltaic sub-cell.

As above, the interconnector is connected to said electrically-conductive layer in said zone.

This results in the above-mentioned photovoltaic module, with all the above-mentioned advantages.

In an alternative method, at least one of said photovoltaic cells is manufactured by:
forming a first photovoltaic sub-cell;
forming a second photovoltaic sub-cell on substantially the whole surface of said first photovoltaic sub-cell;
selectively removing a part of said second photovoltaic sub-cell so as to define a zone in which said second photovoltaic sub-cell is not present;
forming an insulating layer on the surface of said photovoltaic sub-cell in at least part of said zone;
forming a conductive layer on at least part of said insulating layer and on at least part of said second photovoltaic sub-cell.

As before, the cells can be arranged in the module in a conventional or in a shingled configuration.

BRIEF DESCRIPTION OF THE DRAWINGS

Further details of the invention will appear more clearly upon reading the description below, in connection with the following figures which illustrate.

EMBODIMENTS OF THE INVENTION

Figure 1:
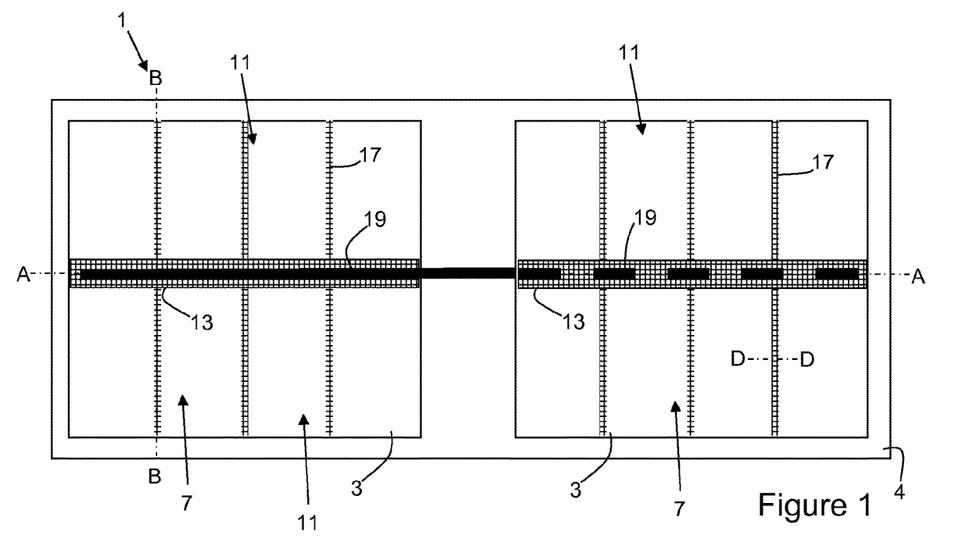
FIG. 1: a schematic plan view of a photovoltaic module according to the invention.
Figure 2:
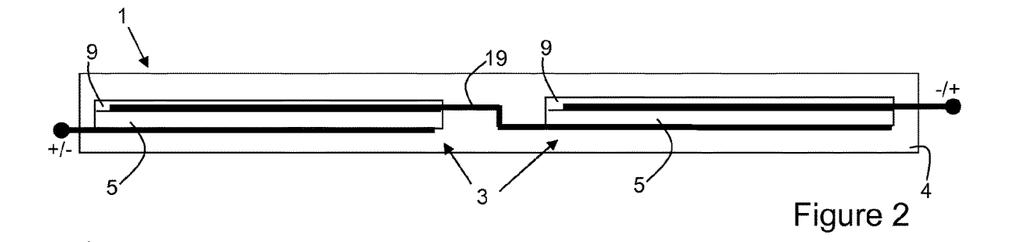
FIG. 2: a schematic sectional view along the line A-A of FIG. 1.
Figure 3:
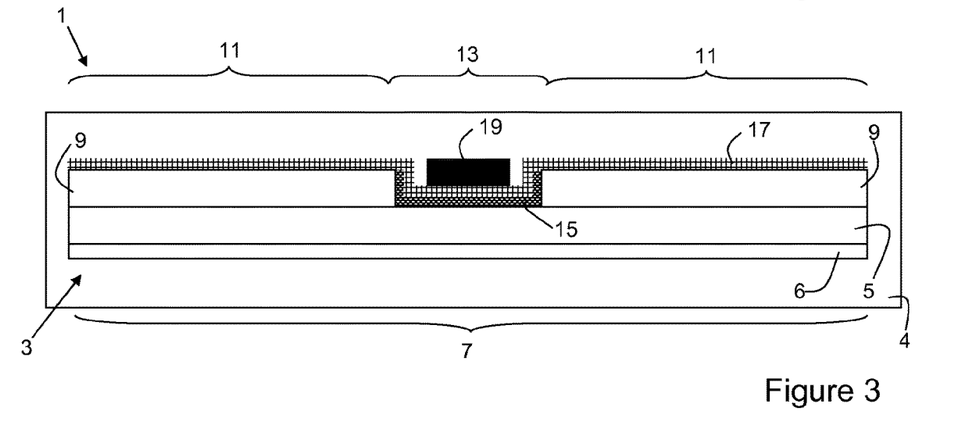
FIG. 3: a schematic sectional view along the line B-B of FIG. 1.

FIGS. 1-3 illustrate schematically a first embodiment of the simplest form of a photovoltaic module 1 according to the invention.

This module 1 comprises a plurality of multijunction photovoltaic cells 3 integrated therein by means of an encapsulant and any structural elements that are present such as a front sheet of glass or polymer, a transparent or opaque back sheet or similar. In the figures, the encapsulant and structural elements are simply illustrated schematically be means of a rectangle 4. Other layers such as anti-reflective layers, coloured layers, haze-producing layers and so on can also be incorporated as is generally known.

Each multijunction photovoltaic cell 3 comprises a first photovoltaic sub-cell 5 and a second photovoltaic sub-cell 9 formed on a surface of the first photovoltaic sub-cell 5 and in electrical connection therewith so as to form a multijunction, as is generally known. A third, and even further, photovoltaic sub-cells can also be provided on one side of either of the first and second sub-cells, or sandwiched between the two, however the invention will be described in the context of tandem cells comprising only two sub-cells 5, 9. Although both cells 3 are illustrated as being identical, this does not have to be the case.

First photovoltaic sub-cell 5 is typically an inorganic photovoltaic sub-cell such as a crystalline silicon-based sub-cell, a thin-film silicon-based sub-cell, a germanium-based sub-cell, a copper indium gallium selenide (CIGS) sub-cell, a CdTe or GaAs sub-cell and so on, and may be of PIN, PN, NIP or NP configuration, and in use would typically be situated facing away from the incident light, i.e. forming the bottom (rear) cell, although use in the opposite orientation is not to be excluded.

Second photovoltaic sub-cell 9 may be of any kind, but the present invention is particularly suited to multijunction cells in which the various layers forming the second sub-cell 9 are relatively fragile compared to the first photovoltaic sub-cell, such is the case with perovskite sub-cells such as those based on $Cs_{0.17}FA_{0.83}Pb(I_xBr_{1-x})_3$ or similar. Other technologies benefitting from the present invention are sub-cells based on quantum dots, organic semiconductors such as phenyl-$C_{61}$-butyric acid methyl ester (PCBM)/poly-3-hexylthiophene (P3HT) sub-cells or sub-cells based on small, non-polymer molecules such as DCV6T-Bu(1,2,5,6) as a donor combined with $C_{60}$ as an absorber, and others. The second photovoltaic sub-cell is typically the top (front) sub-cell, intended to face the direction of arrival of incident light.

It should furthermore be noted that further layers may be provided between the sub-cells 5, 9 or on an outer surface thereof as is generally known, such as a tunnelling layer, passivating layers, conductive layers (e.g. of transparent conductive oxides such as indium tin oxide or similar), capping layers and so on.

First photovoltaic sub-cell 5 extends over a first predetermined area 7, which in the present case is the entire area of each cell 3, although it can alternatively be a sub-area of a suitable substrate. A second photovoltaic sub-cell 9 is provided on said first photovoltaic sub-cell, the second sub-cell 9 extending over a second predetermined area 11 of smaller extent than said first predetermined area 7. In other words, parts of the first photovoltaic sub-cell 5 are not covered by the second photovoltaic sub-cell 9 in a zone 13 corresponding in the area or areas where the first predetermined area 7 and second predetermined area 11 do not overlap and in which the second sub-cell 9 is not present. In the illustrated example, this zone 13 is a single strip extending down the middle of the cell 3, dividing the second predetermined area 11 into two sub-areas, although it is possible to provide several parallel strips dividing the first predetermined area into a greater number of sub-areas, and for the photovoltaic sub-cells 5, 9 to be patterned as is generally known. However, only one such zone 13 is necessary, particularly in the case of small-area cells 3.

As can be seen only on FIG. 3, an electrically-conductive contact layer 6 is also provided on the opposite side of the first photovoltaic sub-cell 5 to the second photovoltaic sub-cell 9 as is generally known, this back contact being patterned if required and being formed of either metal, transparent conductive oxide, conductive ink or any other known suitable material.

In zone 13, the surface of the first photovoltaic sub-cell 5 is provided with an electrically insulating layer 15 (see FIG. 3), formed of a dielectric material compatible with both of the photovoltaic sub-cells 5, 9. Examples of suitable materials include, but are not limited to, $SiO_2$, $Al_2O_3$, $Ta_2O_5$, SiN, BN, AlN, GaN, ZnS, or other oxides, nitrides, sulphides or similar, or organic polymers such as polystyrene, polypropylene, polyethylene, siloxanes etc. It may also be a hybrid material such as a polymer matrix comprising metal oxide nanoparticles. Depending on the material used, it may be deposited by solution deposition (such as screen printing, gravure, inkjet printing, slot-die printing etc), by vapour deposition (such as electron beam deposition, magnetron sputtering, thermal evaporation or similar), and the thickness may be situated between 10 nm and 100 µm, more typically from 100 nm to 10 µm. The insulating layer 15 may cover all or part of the first sub-cell 5 in said zone 13, or may be patterned, as required.

In the illustrated embodiment, the insulating layer 15 also extends up the sidewalls of the second photovoltaic sub-cell 9 adjacent to the zone 13 in order to avoid short circuits or current leakage caused by contact between the second sub-cell 9 and the electrically-conductive layer 17 described below. However, depending on the cell construction, it may be possible to only provide the insulating layer on the surface of the first photovoltaic sub-cell 5, and leave these sidewalls uncovered.

In order to provide an electrical connection between the surface of the second photovoltaic sub-cell and the surface of the insulating layer 15, an electrically-conductive layer 17, typically formed as a patterned metal or transparent conductive grid formed of a transparent conductive oxide, is provided to transport current to an interconnector 19 provided in zone 13. This interconnector 19 is typically a metallic wire or ribbon attached directly to the conductive layer 17 in said zone 13, e.g. by being bonded thereto by conductive adhesive or by being soldered thereto, and serves to connect one electrical side (i.e. positive or negative) of the cell 3 in question to the other electrical side (i.e. negative or positive respectively) of an adjacent cell 3. In the illustrated example, as can be seen from FIG. 2, the cells 3 are front-side and back-side connected, although the same principle can be applied to cells contacted only on one side thereof, such as in the case of interdigitated back contacted cells, which may permit the cells 3 to be operated as a three or four terminal devices. The use of a dashed line to represent the interconnector 19 on FIG. 1 indicates that it is situated on the far side of the right-hand cell 3. In the case in which multiple zones 13 are provided, each zone 13 may be provided with its own interconnector 19.

Electrical connection to the outside of the module has been illustrated schematically by connectors leaving the encapsulation and marked with "+/−" and "−/+".

The structure of the cell 3 as described above has the effect that the interconnector 19 is attached in a zone in which only the mechanically stronger and more resistant first photovoltaic sub-cell 5 is present, and is hence not attached on a weaker surface of the second photovoltaic sub-cell 9. As a result, the interconnector 19 is supported by the stronger first photovoltaic sub-cell 5 and the insulating layer 15, and hence cannot apply any stresses to the second sub-cell 9 that might cause it to fracture or delaminate. Furthermore, in the case in which the interconnect 19 is soldered onto the conductive layer 19, the heat applied for the soldering cannot affect the material of the second photovoltaic sub-cell 9, which is particularly important in the case in which this latter is made of perovskite or an organic semiconductor since these are extremely temperature sensitive and break down when exposed to high temperatures. Although, that being said, the cell and module construction can equally be applied to multijunction cells where the first sub-cell 5 is equally as mechanically strong as the second sub-cell 9.

Figure 4:
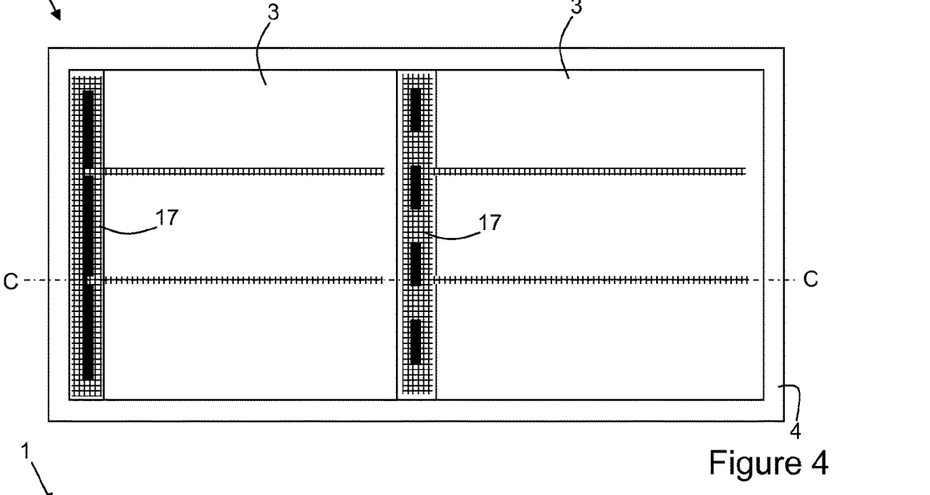
FIG. 4: a schematic sectional view of a further embodiment of a photovoltaic module according to the invention.
Figure 5:
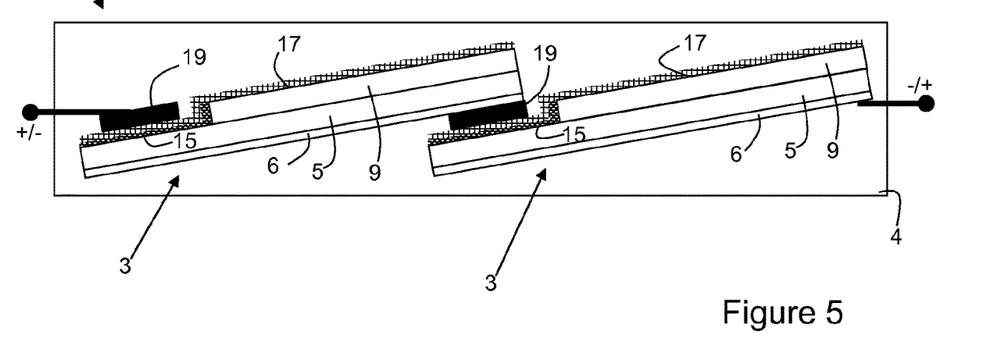
FIG. 5: a schematic sectional view along the line C-C of FIG. 4.

FIGS. 4 and 5 illustrate a second embodiment of the invention which differs from that of FIGS. 1-3 in that the individual cells 3 are overlapped in a so-called "shingle" configuration. To avoid over-loading FIGS. 4 and 5, one cell 3 has been illustrated in isolation in FIG. 6 in order to better illustrate the arrangement of the first predetermined area 7, the second predetermined area 11 and the zone 13 in which the first photovoltaic sub-cell 5 is present but the second photovoltaic sub-cell 9 is not present.

Shingle configurations are discussed e.g. in the paper "Cell-to-Module (CTM) Analysis for Photovoltaic Modules with Shingled Solar Cells", Mittag et al, presented at the 44th IEEE Photovoltaic Specialist Conference, 2017, and serve to eliminate gaps between conventionally-interconnected cells 3 in a module 1 and thereby increase the photovoltaically active area of the module 1.

In such a shingle configuration, each cell 3 is inclined to the plane of the module 1 so that they overlap such that the contact layer 6 of one cell 3 sits upon an interconnector 19 arranged in said zone 13 as before. Naturally, in this configuration zone 13 is arranged along an edge of each cell 3 to permit interconnection in this manner. It should be noted that in this configuration, the interconnector 19 may be a metallic ribbon, may simply be a metallised area situated on one cell 3 or the other, may be quantity of conductive adhesive or similar, or may even simply be a predetermined zone of electrically-conductive layer 17 situated in the zone 13. The interconnector 19 may also be divided up into lengths in the case in which the cells 3 are patterned, one or more of said lengths corresponding to a patterned section of each cell 3.

As in the embodiment of FIGS. 1-3, the interconnection, and in this case also the physical interaction, between the individual cells 3 occurs in the zone 13 where the second photovoltaic sub-cell 9 is not present and hence cannot be damaged by the stresses thereby induced. These stresses are again only subjected to the typically more mechanically resistant first photovoltaic sub-cell 5.

Figure 6:
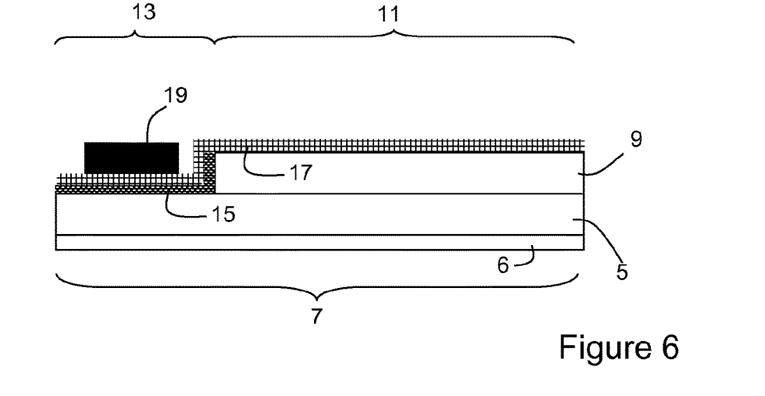
FIG. 6: a schematic sectional view of one of the cells of FIG. 5 along line C-C.
Figure 7:
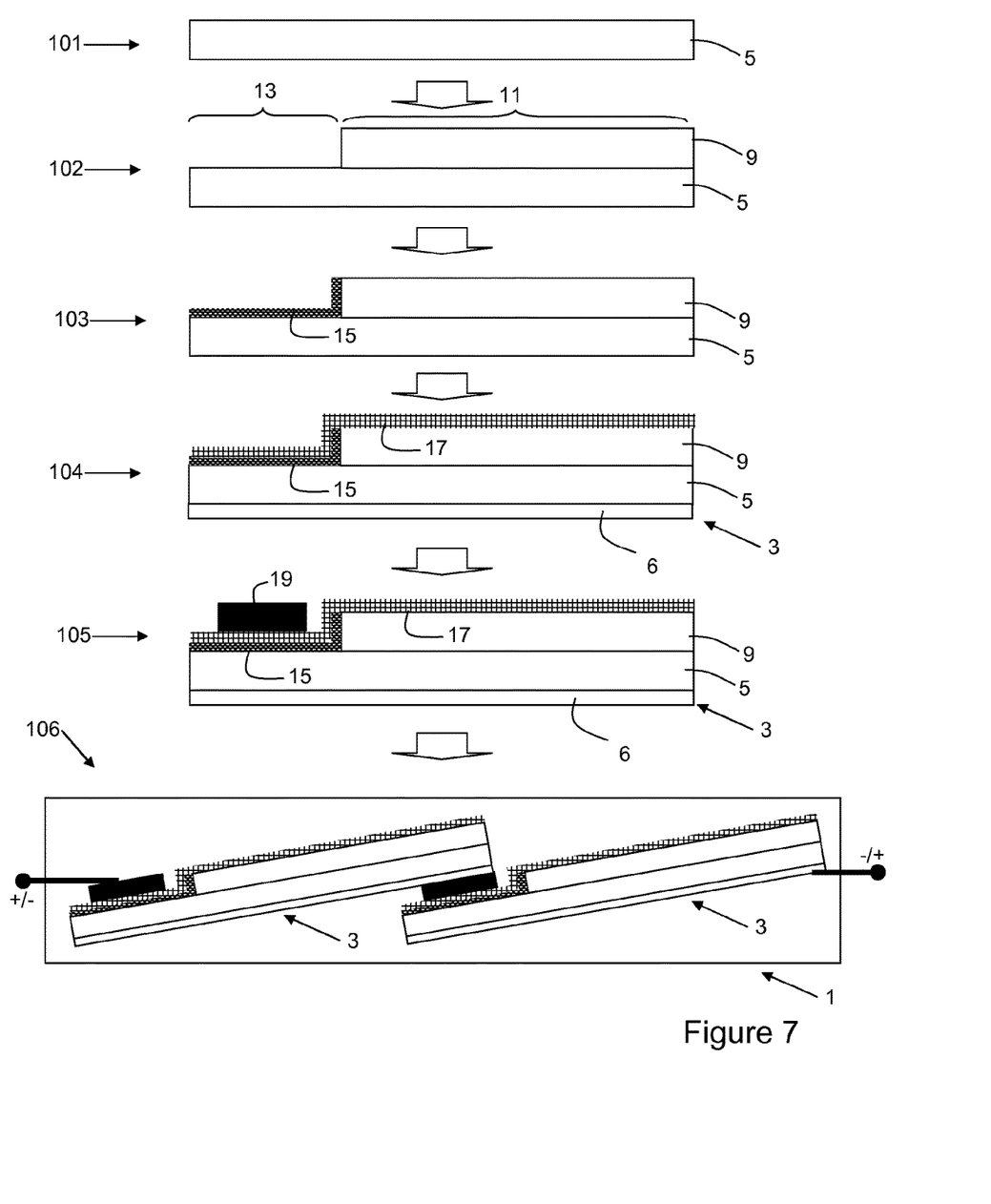
FIG. 7: a schematic flow chart of the main steps of a first variant of a method manufacturing a photovoltaic module according to the invention.
Figure 8:
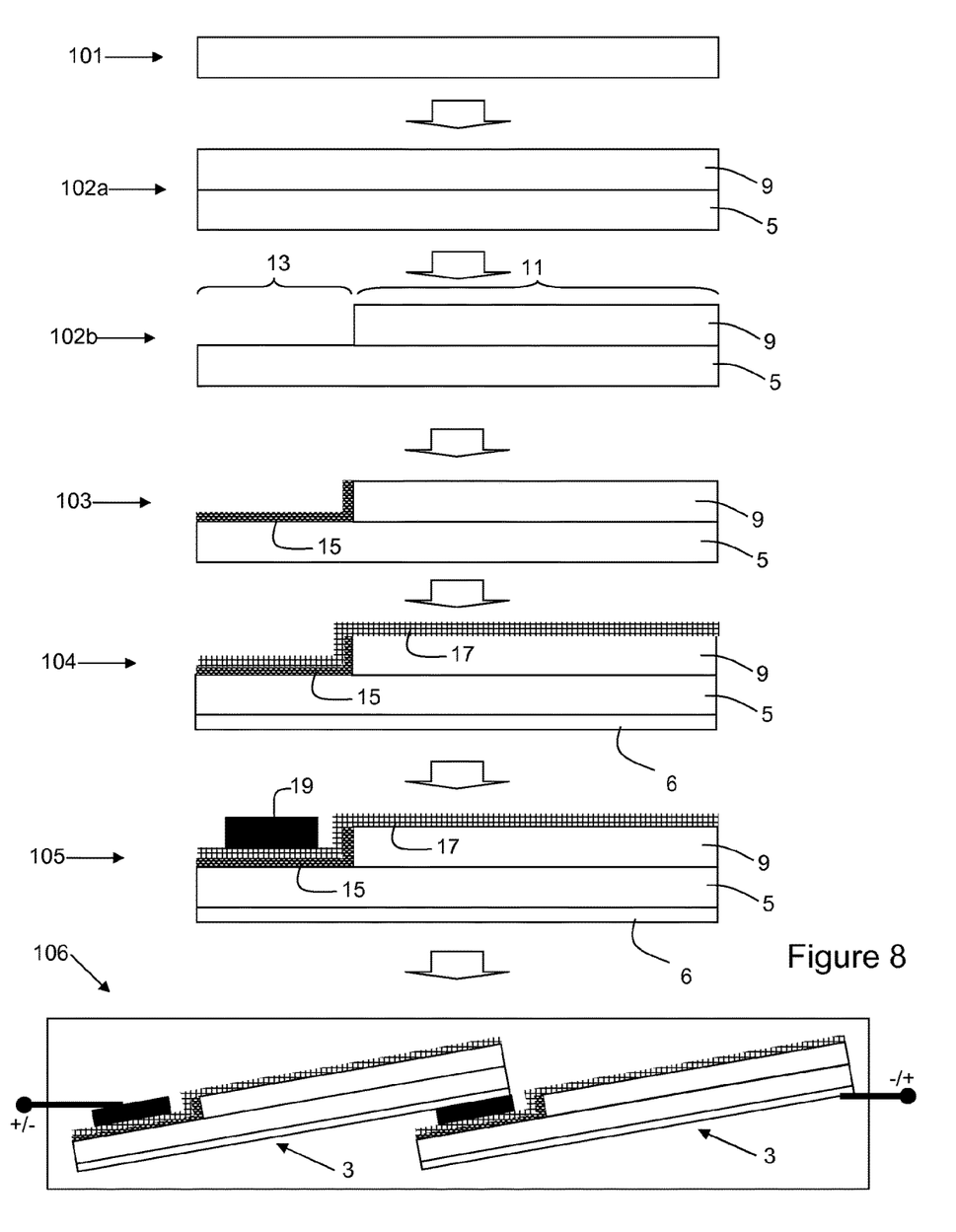
FIG. 8: a schematic flow chart of the main steps of a second variant of a method of manufacturing a photovoltaic module according to the invention.

FIGS. 7 and 8 illustrate schematically methods for manufacturing a module according to the invention, illustrated in the context of the module of FIGS. 4-6. The same principle applies to the module of FIGS. 1-3, the cells 3 being situated in the same plane and the inter-cell connections being arranged appropriately.

In the embodiment of FIG. 7, each cell 3 is manufactured as follows.

In step 101, the first photovoltaic sub-cell 5 is manufactured, e.g. by forming a PIN sub-cell in or on a crystalline silicon wafer as is generally known, for instance by doping one side thereof with p-dopant species and the other side with n-dopant species, or by depositing a p-type layer on one side thereof and by depositing an n-type layer on the other side thereof. Any desired patterning of the first photovoltaic sub-cell 5 can be carried out at this stage or in an intermediate step (not illustrated). Alternatively, if the first photovoltaic sub-cell 5 is not a crystalline silicon sub-cell, it is manufactured as is generally known for the type of sub-cell chosen.

In step 102, the second photovoltaic sub-cell 9 is selectively formed on one side of the first photovoltaic sub-cell 5 over the second predetermined area 11, leaving the zone 13 free of second photovoltaic sub-cell 9. This can be carried out e.g. by masking off the zone 13 with e.g. photoresist, depositing the second photovoltaic sub-cell 9 over the entire surface, and then removing the photoresist to remove the second photovoltaic sub-cell from the zone 13. If the materials of the second photovoltaic sub-cell 9 which can be deposited by wet printing methods (as is the case for perovskite sub-cells), this can be printed in the second predetermined zone 11 e.g. by screen printing, ink-jet printing, gravure or similar. The second photovoltaic sub-cell 9 may be any of the types discussed above, which need not be repeated here. In the variant illustrated, the zone 13 is situated at an edge of the first photovoltaic sub-cell 13 as discussed above. However, in the case of manufacturing a photovoltaic module according to FIGS. 1-3, the zone 13 or sub-zones can be arranged as required.

As part of the same step, any optional intermediate layers (such as transparent conductive layers) situated between the first and second photovoltaic sub-cells 5, 9 can also be deposited as desired.

In step 103, the insulating layer 15 is deposited on the surface of the first photovoltaic sub-cell 15 which is in the zone 13, i.e. the surface which is contiguous with that upon which the second photovoltaic sub-cell 9 has been formed. This insulating layer may also cover the sidewall of this latter adjacent to the zone, but this is not always necessary, and may be deposited by any of methods discussed above.

In step 104, the conductive layer 17 is deposited on the insulating layer 15 and also parts of the second photovoltaic sub-cell 9. The conductive layer 17 may be patterned if desired, as is generally known. This can be advantageously carried out by screen printing, inkjet printing or similar of conductive material, or alternatively can be deposited as is generally known.

The electrically-conductive contact layer 6 can be formed by deposition, printing or similar at any convenient moment in the process, for instance after step 101, 102 or 103. For convenience, it has been illustrated as being formed in step 104.

In step 105, the interconnector 19 is applied to the surface of the conductive layer 17 in the zone 13, by either deposition of a conductive substance such as a metal, a conductive glue, a conductive ink, or by bonding a conductive wire or ribbon to the conductive layer 17.

In step 106, a plurality of the cells 3 thereby formed are assembled and interconnected into a photovoltaic module 1 according to the invention.

In the alternative case in which the first photovoltaic sub-cell 5 is based formed by thin-film deposition techniques, it may be formed in step 101 on a substrate upon which the electrically-conductive contact layer 6 has previously been deposited.

Figure 9:
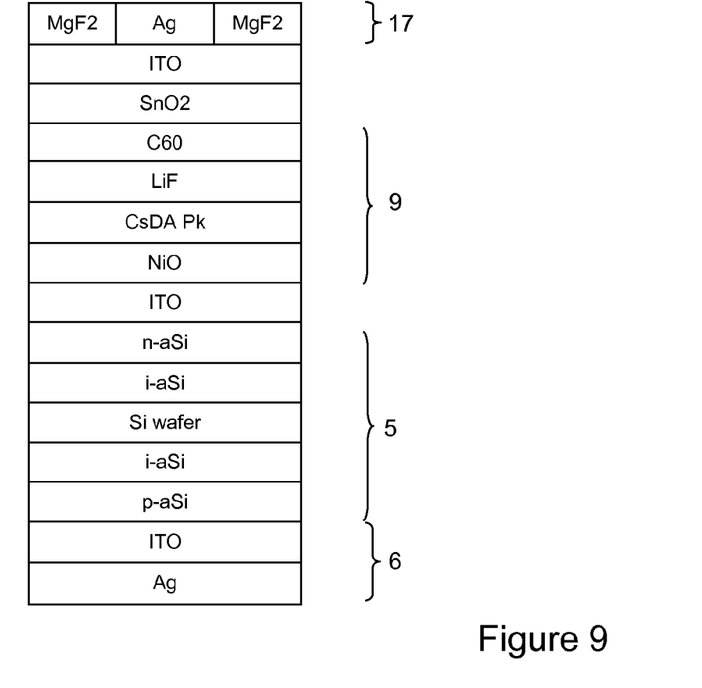
FIG. 9: a detailed schematic cross-section of a photovoltaic cell along the line D-D of FIG. 1.

The method of FIG. 8 differs from that of FIG. 7 in that step 102 is divided into two sub-steps 102a and 102b. In sub-step 102a, the second photovoltaic sub-cell 9 is formed on substantially the entire surface of the first photovoltaic sub-cell 5 rather than only on a portion thereof. Subsequently, the zone 13 is defined by removal of a portion of the second photovoltaic sub-cell 9 by e.g. laser ablation, a lift-off process or mechanical removal, to leave the zone 13 free of the second photovoltaic sub-cell 9. The other steps remain unchanged Finally, FIG. 9 illustrates in more detail part of an example multijunction photovoltaic cell 3, in section corresponding to the line D-D of FIG. 1.

In this example, the first photovoltaic sub-cell comprises a crystalline silicon wafer upon one side of which a layer of intrinsic amorphous silicon followed by an n-type layer of amorphous silicon has been deposited. On the opposite side of the wafer, another intrinsic amorphous layer and a p-type amorphous silicon layer have likewise been deposited. The contact layer 6 is situated on this latter layer, and comprises a multilayer of metallic silver deposited upon an indium tin oxide (ITO) layer.

On the above-mentioned n-type a-Si layer, an intermediate transparent conductive layer of indium tin oxide has been deposited, separating the two sub-cells 5, 9 while retaining electrical connection therebetween. The second photovoltaic sub-cell 9 has been formed on this intermediate ITO layer, and is a perovskite-based sub-cell comprising a layer stack of, considered from the ITO layer, a nickel oxide layer, a layer of $Cs_{0.17}FA_{0.83}Pb(I_xBr_{1-x})_3$ (referenced as CsFA Pk on FIG. 9), a layer of lithium fluoride, and a carbon-60-based layer. Upon this latter layer is situated a double-layer of transparent conductive oxides, namely tin oxide and indium tin oxide, upon which the electrically-conductive layer 17 is deposited, interposed with magnesium difluoride electron-sensitive contacts.

Figure 10:
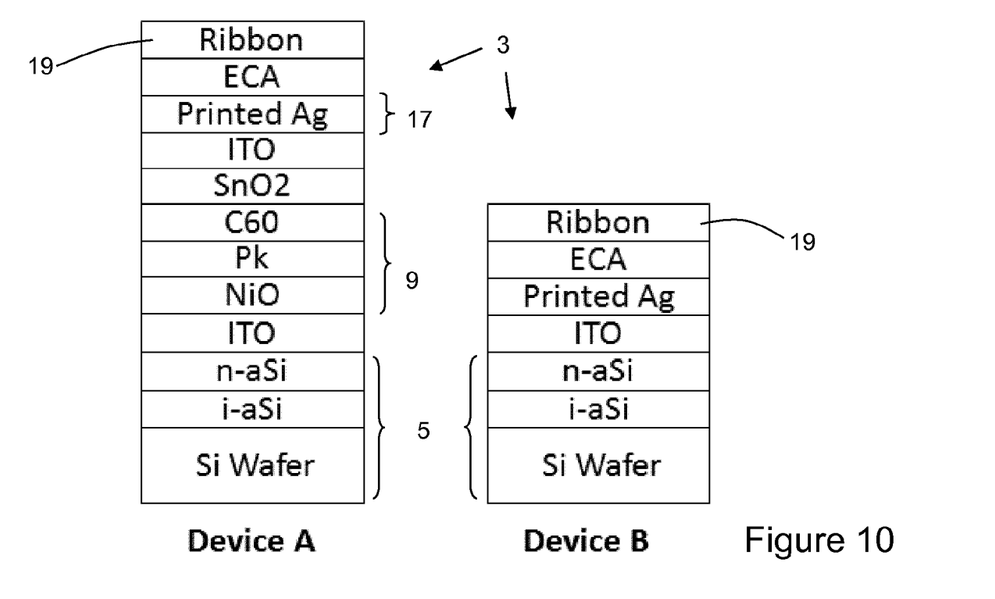
FIG. 10: a schematic cross-section of two partial photovoltaic cell structures subjected to a peel test.
Figure 11:
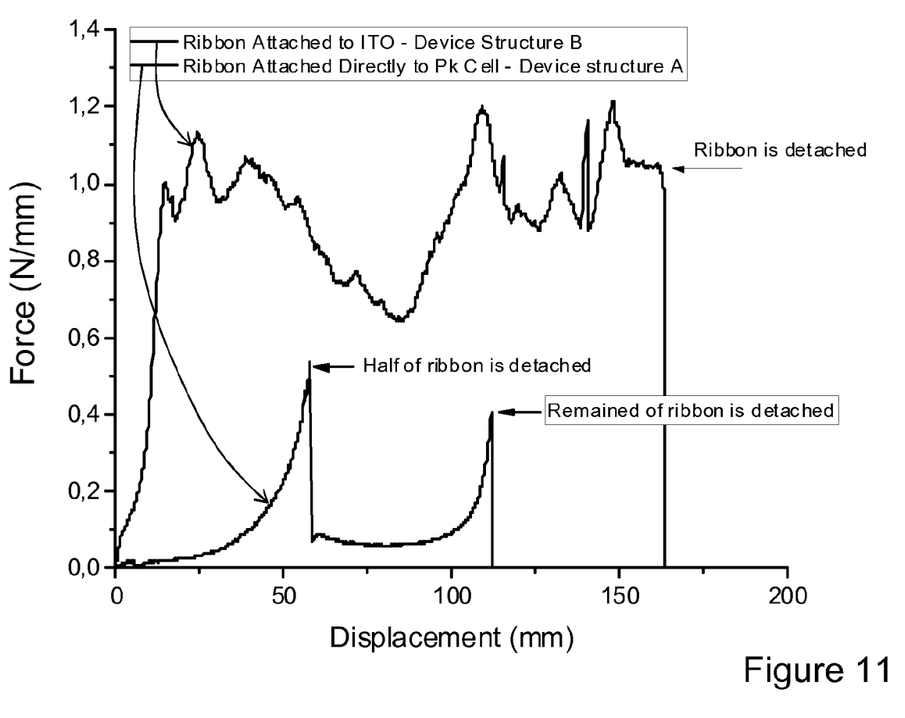
FIG. 11: a graph of the results of said peel test.

Finally, FIG. 10 illustrates schematically two partial cell constructions submitted to a peel test, and FIG. 11 illustrates a graph of the results of this test.

Device A corresponds broadly to the construction of FIG. 9, with layers omitted on the side of the silicon wafer facing away from the second sub-cell 9 being omitted since they are irrelevant to a mechanical peel test. The second sub-cell 9 of device A is based on perovskite as above.

Furthermore, upon the ITO layer, a silver layer comprising a pattern of 0.6 mm wide bus bars was printed using standard low-temperature silver paste designed for silicon heterojunction solar cells, and was cured at 130° C. for 10 minutes in a standard belt furnace. 1 mm wide metallic ribbons representing electrical interconnectors 19 were affixed to the printed silver bus bars by means of electrically-conductive adhesive (ECA) cured for 2 minutes at 120° C.

Device B, on the other hand, omits the perovskite second sub-cell 9, and comprises simply a layer of ITO, a printed silver layer, and a metallic ribbon affixed thereupon as before, the ITO layer being situated directly on the n-aSi layer of the partial first sub-cell 5.

As a result, device A is representative of the situation in which an electrical interconnector 19 would be attached to the surface of the second sub-cell 9 in the area in which both sub-cells are present, and device B is representative of attaching an electrical interconnector 19 in the zone 13 in which the first sub-cell 5 is not covered by the second sub-cell 9.

A number of devices of each type were constructed, and the strength of the ribbon attachment was measured using a 180° pull-test measuring the force applied to the ribbon as it was pulled off of the substrate. The pull-test was performed at a displacement speed of 100 mm/s, in accordance with the procedure described in Eitner, U.; Rendlar, L. C. 'Peel testing of ribbons on solar cells at different angles consistent comparison by using adhesive fracture energies', Presented at 29th EUPVSEC, 22-26 Sep. 2014, Amsterdam, The Netherlands.

Under the pull test, devices with structure B showed a smooth removal of the ribbon with fracture occurring within the ECA paste itself at a force of between about 0.6 and 1.2 N per mm of ribbon width. The average measured peel force for these for these substrates was approximately 1 N/mm. A typical pull curve is illustrated in FIG. 11 (upper curve).

Devices with structure A, corresponding to an attachment of the ribbon to the perovskite second sub-cell, showed very different behaviour. In all cases, large portions of the ribbon would detach suddenly and catastrophically during measurement, preventing the calculation of a reasonable pull strength number. A typical pull curve is again graphed and annotated in FIG. 11 (lower curve). Unlike in structure B, the detachment point in structure A was within the perovskite stack itself highlighting the mechanical weakness in these materials.

As a result, it can be clearly seen how the module construction of the invention results in a significantly improved structural integrity of the individual cells 3, reducing the risk of damage to the cell due to forces applied by the electrical interconnector 19.

Although the invention has been described in terms of specific embodiments, variations thereto are possible without departing from the scope of the invention as defined in the appended claims.

The invention claimed is:

1. A photovoltaic module comprising a plurality of multijunction photovoltaic cells, at least one of said plurality of multijunction photovoltaic cells comprising:
   a first photovoltaic sub-cell having a first area;
   a second photovoltaic sub-cell provided on said first photovoltaic sub-cell and in electrical connection therewith to define a multijunction cell, said second photovoltaic sub-cell having a second area which is smaller than said first area to define at least one zone in which said first photovoltaic sub-cell is uncovered by said second photovoltaic sub-cell;
   an electrically-insulating layer situated upon said first photovoltaic sub-cell in at least a portion of said at least one zone; and
   an electrically-conductive layer situated upon at least a portion of said electrically-insulating layer and in electrical connection with a surface of said second photovoltaic sub-cell,
   wherein said at least one of said plurality of multijunction photovoltaic cells is electrically connected to at least one other of said plurality of multijunction photovoltaic cells by at least one electrical interconnector electrically connected to said electrically-conductive layer in said at least one zone.

2. The photovoltaic module according to claim 1, wherein said electrically-insulating layer extends over at least a portion of a lateral surface of said second photovoltaic sub-cell adjacent to said at least one zone.

3. The photovoltaic module according to claim 1, wherein said first photovoltaic sub-cell comprises an inorganic semiconductor based photovoltaic sub-cell.

4. The photovoltaic module according to claim 1, wherein said second photovoltaic sub-cell comprises at least one of:
   a perovskite-based photovoltaic sub-cell;
   an organic semiconductor based photovoltaic sub-cell; and
   a quantum dot based photovoltaic sub-cell.

5. The photovoltaic module according to claim 1, wherein said plurality of multijunction photovoltaic cells extend in substantially a single plane and wherein said at least one electrical interconnector is at least one wire or ribbon.

6. The photovoltaic module according to claim 1, wherein said at least one zone is situated adjacent to an edge of said first photovoltaic sub-cell, said plurality of multijunction photovoltaic cells being arranged in a shingle configuration and said least one electrical interconnector being sandwiched between said at least one zone of one photovoltaic cell and a surface of an adjacent photovoltaic cell.

7. The photovoltaic module according to claim 1, wherein said at least one of said plurality of multijunction photovoltaic cells further comprises an electrically-conductive contact layer on a surface of said first photovoltaic sub-cell facing away from said second photovoltaic sub-cell.

* * * * *